(12) United States Patent
Basha et al.

(10) Patent No.: US 11,923,813 B2
(45) Date of Patent: *Mar. 5, 2024

(54) PULSE WIDTH MODULATED AMPLIFIER (71) Applicant: Texas Instruments Incorporated, Dallas, TX (US)

(72) Inventors: Shaik Asif Basha, Bengaluru (IN); Mohit Chawla, Bangalore (IN); Jasjot Singh Chadha, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/503,405

(22) Filed: Oct. 18, 2021

(65) Prior Publication Data
US 2022/0094312 A1 Mar. 24, 2022

Related U.S. Application Data (63) Continuation of application No. 17/024,994, filed on Sep. 18, 2020, now Pat. No. 11,177,785.

(51) Int. Cl.
H03F 3/217 (2006.01)
H03F 3/185 (2006.01)
H03F 3/38 (2006.01)
H03K 4/90 (2006.01)

(52) U.S. Cl.
CPC ............ *H03F 3/2173* (2013.01); *H03K 4/90* (2013.01); *H03F 2200/03* (2013.01); *H03F 2200/351* (2013.01)

(58) Field of Classification Search
CPC .............. H03F 3/2173; H03F 2200/03; H03F 2200/351; H03F 3/183; H03K 4/90
USPC ....................................... 330/10, 207 A, 251
See application file for complete search history.

(56) References Cited

U.S. PATENT DOCUMENTS

| 9,369,096 | B2 | 6/2016 | Yuan et al. | |
| 10,862,471 | B2 * | 12/2020 | Coyne | H03F 3/217 |
| 11,290,070 | B2 * | 3/2022 | Zanbaghi | H03F 3/2173 |
| 2006/0044057 | A1 | 3/2006 | Hezar et al. | |

* cited by examiner

*Primary Examiner* — Hieu P Nguyen
(74) *Attorney, Agent, or Firm* — John R. Pessetto; Frank D. Cimino (57) ABSTRACT A pulse width modulated (PWM) amplifier includes a synchronization logic circuit having a first input configured to receive a bridge control signal and having a second input configured to receive a clock signal. The synchronization logic circuit is configured to provide a slope switch signal and a reference switch signal. The PWM amplifier includes a ramp generator having a first input configured to receive a first voltage supply and having a second input configured to receive a second voltage supply and having a third input configured to receive the reference switch signal and having a fourth input configured to receive the slope switch signal. The ramp generator is configured to provide a ramp signal having a first slope responsive to the slope switch signal in a first state and having a second slope responsive to the slope switch signal in a second state and to provide the clock signal.

10 Claims, 5 Drawing Sheets

PULSE WIDTH MODULATED AMPLIFIER

CROSS-REFERENCE TO RELATED APPLICATION(S)

This continuation application claims priority to U.S. patent application Ser. No. 17/024,994, filed Sep. 18, 2020, which application is incorporated herein by reference in its entirety.

BACKGROUND

The disclosure generally relates to pulse width modulated (PWM) amplifiers.

DESCRIPTION OF THE RELATED ART

A pulse width modulated (PWM) amplifier is a switching amplifier in which transistors (e.g., MOSFETs) operate as electronic switches. A modulator encodes an audio input signal using pulse width into a pulse train of fixed amplitude but varying width and separation. The pulse train is then used as gate signals to drive the transistors ON and OFF alternately. As a result, the transistors rapidly switch back and forth between supply voltage rails, thus providing PWM output signals. The PWM output signals are then passed through a low pass filter which blocks high frequency harmonics but allows the audio signal to escape. Since the transistors are either ON or OFF, they spend little time in a linear region. As a result, the transistors dissipate minimal power and are highly efficient.

Due to its high efficiency, the PWM amplifier is used in audio systems. During operation, an audio system is required to provide either average output power or low output power most of the time, and less than 20% of the time the audio system is required to provide peak output power. For optimal power delivery, the PWM amplifier can be coupled to a Y-bridge driver which is selectively switched between a high voltage supply and a low voltage supply. The Y-bridge driver is switched to the low voltage supply when either low output power or average output power is necessary. If peak output power is necessary, the Y-bridge driver is switched to the high voltage supply.

In a PWM amplifier, a ramp generator provides a ramp signal which is compared to an audio signal to produce the pulse train which is applied to the Y-bridge driver. In order to maintain a constant audio signal gain, the peak amplitude of the ramp signal must track the voltage supplies as the Y-bridge is switched between the high voltage supply and the low voltage supply. Existing PWM amplifiers rely on separate ramp generators to produce two ramp signals to maintain a constant audio signal gain. However, a phase and a frequency offset between the two separate ramp generators requires a master phase locked loop (PLL) and a slave PLL to synchronize the two ramp generators. Generally, the master PLL is placed in one of the ramp generators and the slave PLL is placed in the other ramp generator, thus consuming space in an integrated circuit (IC).

SUMMARY

Various aspects of the present disclosure are directed to a pulse width modulated (PWM) amplifier. In one aspect, the PWM amplifier includes a digital-to-analog converter (DAC) having an input configured to receive digital audio data and to provide first and second differential analog audio signals. The PWM amplifier also includes a synchronization logic circuit having a first input configured to receive a bridge control signal and having a second input configured to receive a clock signal. The synchronization logic circuit is configured to provide a slope switch signal and a reference switch signal. The PWM amplifier also includes a ramp generator having a first input configured to receive a first voltage supply and having a second input configured to receive a second voltage supply and having a third input configured to receive the reference switch signal and having a fourth input configured to receive the slope switch signal. The ramp generator is configured to provide a ramp signal having a first slope responsive to the slope switch signal in a first state and having a second slope responsive to the slope switch signal in a second state and to provide the clock signal. The PWM amplifier also includes a loop filter having a first input configured to receive the first differential analog audio signal and having a second input configured to receive the second differential analog audio signal and having a third input configured to receive a first differential output signal and having a fourth input configured to receive a second differential output signal. The loop filter is configured to provide first and second compensated analog signals. The PWM amplifier also includes a comparator having a first input configured to receive the ramp signal and having second and third inputs configured to receive the respective first and second compensated analog signals. The comparator is configured to provide first and second PWM gate signals. The PWM amplifier also includes a first Y-bridge driver configured to receive the first PWM gate signal and an inverted first differential PWM gate signal and to provide the first differential output signal. The PWM amplifier also includes a second Y-bridge driver configured to receive the second PWM gate signal and an inverted second differential PWM gate signal and to provide the second differential output signal.

In an additional aspect of the disclosure, the synchronization logic circuit is configured to generate the reference switch signal based on the bridge control signal and the clock signal, and the synchronization logic circuit is configured to generate the slope switch signal based on the reference switch signal and the clock signal.

In an additional aspect of the disclosure, a rising edge of the reference switch signal is coincident with a transition of the clock signal after a rising edge of the bridge control signal, and a falling edge of the reference switch signal is coincident with a transition of the clock signal after a falling edge of the bridge control signal.

In an additional aspect of the disclosure, a rising edge of the slope switch signal is coincident with a rising edge of the reference switch signal, and a falling edge of the slope switch signal lags a falling edge of the reference switch signal by a half clock cycle period of the clock signal.

In an additional aspect of the disclosure, a LOW to HIGH transition of the slope switch signal and a LOW to HIGH transition of the reference switch signal occur concurrently, and a HIGH to LOW transition of the slope switch signal lags a HIGH to LOW transition of the reference switch signal by a half clock cycle period of the clock signal.

In an additional aspect of the disclosure, the ramp generator is configured to provide the ramp signal having the first slope responsive to the slope switch being HIGH, and the ramp generator is configured to provide the ramp signal having the second slope responsive to the slope switch being LOW.

In an additional aspect of the disclosure, a Y-bridge driver system includes a first Y-bridge and a second Y-bridge. The first Y-bridge includes a first high-side NMOS transistor.

The first high-side NMOS transistor includes a drain terminal configured to receive a first voltage supply and includes a source terminal coupled to a first differential output terminal. The first high-side NMOS transistor includes a gate terminal configured to receive a first differential pulse width modulated (PWM) gate signal responsive to a slope switch signal being HIGH. The first Y-bridge also includes a first low-side NMOS transistor. The first low-side NMOS transistor includes a drain terminal configured to receive a second voltage supply and includes a source terminal coupled to the first differential output terminal. The first low-side NMOS transistor includes a gate terminal configured to receive a first PWM gate signal responsive to the slope switch signal being LOW. The first Y-bridge also includes a first common NMOS transistor. The first common NMOS transistor includes a drain terminal coupled to the first output terminal and includes a source terminal coupled to ground. The first common NMOS transistor includes a gate terminal configured to receive an inverted first PWM gate signal. The first Y-bridge is configured to provide a first differential output signal at the first differential output terminal.

The second Y-bridge includes a second high-side NMOS transistor. The second high-side NMOS transistor includes a drain terminal configured to receive the first voltage supply and includes a source terminal coupled to a second differential output terminal. The second high-side NMOS transistor includes a gate terminal configured to receive a second PWM gate signal responsive to the slope switch signal being HIGH. The second Y-bridge also include a second low-side NMOS transistor. The second low-side NMOS transistor includes a drain terminal configured to receive a second voltage supply and includes a source terminal coupled to the second differential output terminal. The second low-side NMOS transistor includes a gate terminal configured to receive the second PWM gate signal responsive to the slope switch signal being LOW. The second Y-bridge also includes a second common NMOS transistor. The second common NMOS transistor includes a drain terminal coupled to the second differential output terminal and includes a source terminal coupled to ground. The second common NMOS transistor includes a gate terminal configured to receive an inverted second PWM gate signal. The second Y-bridge is configured to provide a second differential output signal at the second differential output terminal.

The Y-bridge driver system also includes a digital-to-analog converter (DAC) having an input configured to receive digital audio data and to provide first and second differential analog audio signals. The Y-bridge driver system also includes a synchronization logic circuit having a first input configured to receive a bridge control signal and having a second input configured to receive a clock signal. The synchronization logic circuit is configured to provide the slope switch signal and a reference switch signal. The Y-bridge driver system also includes a ramp generator having a first input configured to receive the first voltage supply and having a second input configured to receive the second voltage supply and having a third input configured to receive the reference switch signal and having a fourth input configured to receive the slope switch signal. The ramp generator is configured to provide a ramp signal having a first slope responsive to the slope switch signal in a first state and having a second slope responsive to the slope switch signal in a second state. The Y-bridge driver system also includes a loop filter having a first input configured to receive the first differential analog audio signal and having a second input configured to receive the second differential analog audio signal and having a third input configured to receive the first differential output signal and having a fourth input configured to receive the second differential output signal. The loop filter is configured to provide first and second compensated analog signals. The Y-bridge driver system also includes a comparator having a first input configured to receive the ramp signal and having second and third inputs configured to receive the respective first and second compensated analog signals. The comparator is configured to provide first and second differential PWM gate signals. The synchronization logic circuit is configured to generate the reference switch signal based on the bridge control signal and the clock signal, and the synchronization logic circuit is configured to generate the slope switch signal based on the reference switch signal and the clock signal.

In an additional aspect of the disclosure, a PWM amplifier synchronized with an external clock signal includes a digital-to-analog converter (DAC) having an input configured to receive digital audio data and to provide first and second differential analog audio signals. The PWM amplifier also includes a synchronization logic circuit having a first input configured to receive a bridge control signal and having a second input configured to receive an external clock signal and having a third input configured to receive a positive trigger signal and having a fourth input configured to receive a negative trigger signal. The synchronization logic circuit is configured to provide a slope switch signal, a reference switch signal, and a freeze ramp signal. The PWM amplifier also includes a ramp generator having a first input configured to receive a first voltage supply and having a second input configured to receive a second voltage supply and having a third input configured to receive the reference switch signal and having a fourth input configured to receive the slope switch signal and having a fifth input configured to receive the freeze ramp signal and having a sixth input configured to receive the external clock signal. The ramp generator is configured to provide a ramp signal having a first slope responsive to the slope switch signal in a first state and having a second slope responsive to the slope switch signal in a second state and configured to provide the positive trigger signal and the negative trigger signal. The PWM amplifier also includes a loop filter having a first input configured to receive the first differential analog audio signal and having a second input configured to receive the second differential analog audio signal and having a third input configured to receive a first differential output signal and having a fourth input configured to receive a second differential output signal. The loop filter is configured to provide first and second compensated analog signals. The PWM amplifier also includes a comparator having a first input configured to receive the ramp signal and having second and third inputs configured to receive the respective first and second compensated analog signals. The comparator is configured to provide first and second PWM gate signals. The PWM amplifier also includes a first Y-bridge driver configured to receive the first PWM gate signal and an inverted first PWM gate signal and to provide the first differential output signal and includes a second Y-bridge driver configured to receive the second PWM gate signal and an inverted second PWM gate signal and to provide the second differential output signal.

In an additional aspect of the disclosure, the ramp signal transitions from a negative slope to a positive slope concurrent with the negative trigger signal and the ramp signal transitions from a positive slope to a negative slope concurrent with the positive trigger signal, and the ramp signal is frozen responsive to the freeze ramp signal.

In an additional aspect of the disclosure, if the ramp signal rises above an upper reference voltage, the ramp signal is held frozen at the upper reference voltage level until a next transition of the external clock signal, and if the ramp signal falls below a lower reference voltage the ramp signal is held frozen at the lower reference voltage level until a next transition of the external clock signal.

In an additional aspect of the disclosure, during an ascent the ramp signal is held frozen at the upper reference voltage level if the ramp signal rises above the upper reference voltage, and the ramp signal begins a descent upon occurrence of the next transition of the external clock signal.

In an additional aspect of the disclosure, during a descent the ramp signal is held frozen at the lower reference voltage level if the ramp signal falls below the lower reference voltage, and the ramp signal begins an ascent until an occurrence of the next transition of the external clock signal.

DETAILED DESCRIPTION

Reference will now be made in detail to the embodiments, examples of which are illustrated in the accompanying drawings, in which some, but not all embodiments are shown. Indeed, the concepts may be embodied in many different forms and should not be construed as limiting herein. Rather, these descriptions are provided so that this disclosure will satisfy applicable requirements.

Figure 1:
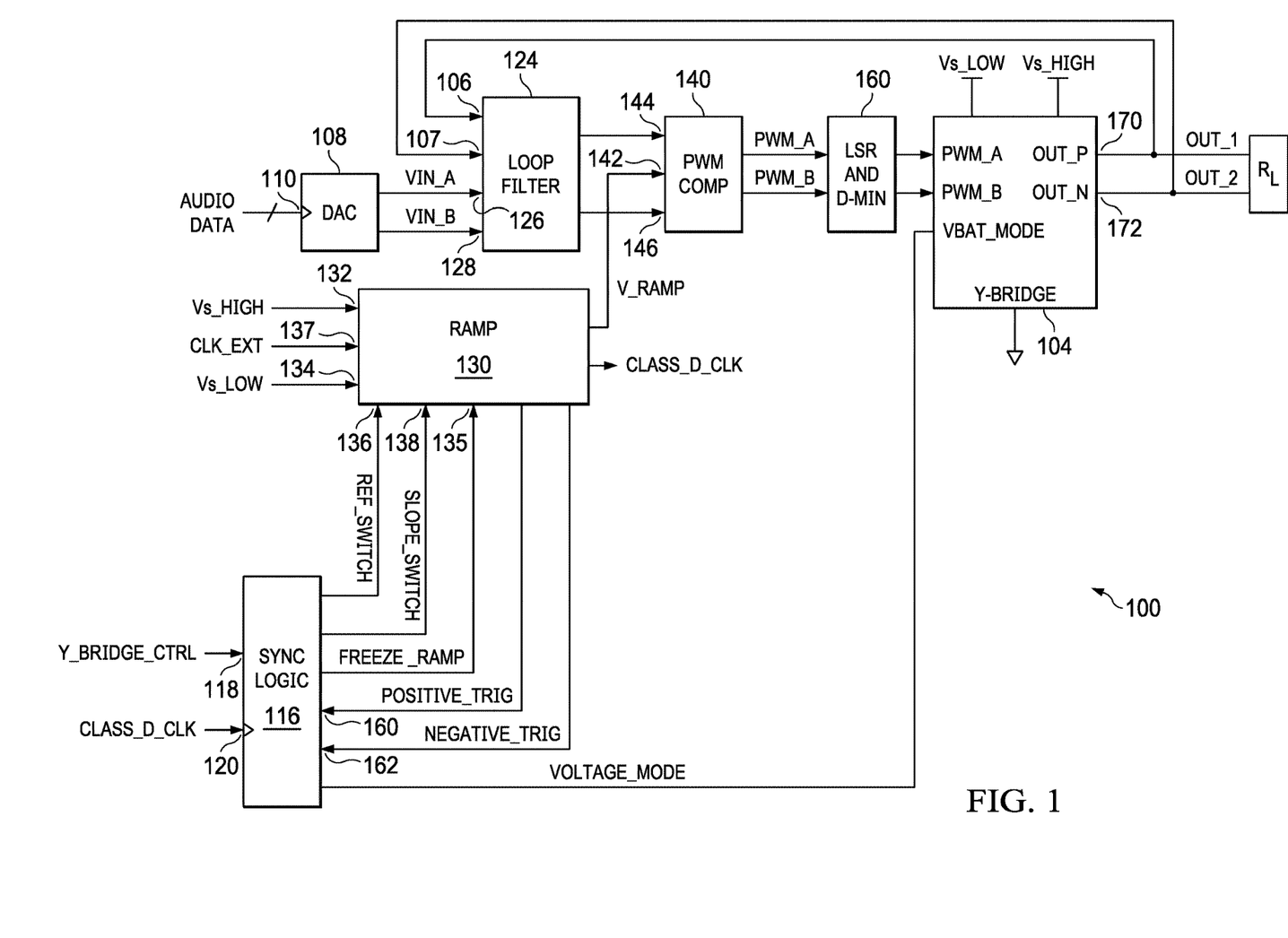
FIG. 1 is a block diagram of a PWM amplifier in accordance with an exemplary embodiment of the present disclosure.

FIG. 1 is a block diagram of a pulse width modulated (PWM) amplifier 100 in accordance with an exemplary embodiment of the present disclosure. The PWM amplifier 100 is configured to drive two differential Y-bridge drivers. In FIG. 1, a first Y-bridge driver 104 is shown coupled to the PWM amplifier 100.

Depending on the output power requirement, the first Y-bridge driver 104 is selectively coupled to a high voltage supply (e.g., 12V) or a low voltage supply (e.g., 5V). Since for audio signal delivery, it is generally necessary to provide only average and low output power most of the time, the PWM amplifier 100 is switched to the low voltage supply most of the time. If peak output power is necessary, the PWM amplifier 100 is switched to the high voltage supply. By switching between the high voltage supply and the low voltage supply depending on the output power requirement, the PWM amplifier 100 improves efficiency and delivers power optimally.

With reference to FIG. 1, the PWM amplifier 100 includes a digital-to-analog converter (DAC) 108 having an input 110 configured to receive digital audio data Audio_In, and in response provides first and second differential analog audio signals Vin_A and Vin_B.

The PWM amplifier 100 also includes a synchronization logic circuit 116 coupled to a ramp generator 130 which can be operated in an oscillation mode or in a synchronization mode. When the ramp generator 130 is operated in the oscillation mode, a clock signal CLK, also referred to as a Class D clock, is generated by the ramp generator 130 and the clock signal CLK is provided to the synchronization logic circuit 116. When operated in the synchronization mode, an external clock signal CLK_EXT is provided to the ramp generator 130, and the external clock signal CLK_EXT is also provided to the synchronization logic circuit 116. Thus, in the synchronization mode, the external clock signal CLK_EXT is provided as the Class D clock to the synchronization logic circuit 116. In the description that follows, the oscillation mode is described first, followed by a description of the synchronization mode.

With continuing reference to FIG. 1, the synchronization logic circuit 116 has a first input 118 configured to receive a bridge control signal Bridge_Control. The bridge control signal, which is derived from the digital audio data Audio_In, indicates whether the PWM amplifier 100 needs to deliver peak output power or an average (or low) output power.

In the oscillation mode, the synchronization logic circuit 116 receives a clock signal CLK (also referred to herein as Class D CLK) at a second input 120. The synchronization logic circuit 116 is configured to provide a slope switch signal Slope_Switch and a reference switch signal Ref_Switch. In an exemplary embodiment, the reference switch signal Ref_Switch is generated by synchronizing the bridge control signal Bridge_Control with the clock signal CLK, and the slope switch signal Slope_Switch is generated using the reference switch signal Ref_Switch and the clock signal CLK.

With continuing reference to FIG. 1, in the oscillation mode the ramp generator 130 receives the high voltage supply Vs_High at a first input 132 and receives the low voltage supply Vs_Low at a second input 134. The ramp generator 130 also receives the reference switch signal at a third input 136 and receives the slope switch signal at a fourth input 138. The ramp generator 130 is configured to provide a ramp signal V_Ramp which has a first slope when the slope switch signal Slope_Switch is in a first state (e.g., HIGH) and has a second slope when the slope switch signal Slope_Switch is in a second state (e.g., LOW). The ramp generator 130 is also configured to provide the clock signal CLK (Class D CLK) by comparing the ramp signal V_Ramp to Vs_HIGH and Vs_LOW.

In an exemplary embodiment, the ramp signal V_Ramp is generated using Vs_HIGH, Vs_LOW and a desired audio signal gain. The audio signal gain can be represented as: Audio Signal Gain=Vs_HIGH/V_Ramp_Peak; or Audio Signal Gain=Vs_LOW/V_Ramp_Peak, where V_Ramp_Peak is the peak to peak ramp signal amplitude. When the Slope_Switch is HIGH, the ramp signal V_Ramp produces the first slope corresponding to Vs_High, and when the Slope_Switch is LOW, the ramp signal V_Ramp produces the second slope corresponding to Vs_LOW.

The PWM amplifier 100 also includes a loop filter 124 which includes a first input 126 configured to receive the first differential analog audio signal Vin_A and includes a second input 128 configured to receive the second differential analog audio signal Vin_B. The loop filter 124 also includes a third input 106 configured to receive a first differential output signal Out_1 and includes a fourth input 107 configured to receive a second differential output signal Out_2. The loop filter 124 senses the output signals Out_1 and Out_2 and in response provides compensated analog signals Vin_A_Comp and Vin_B_Comp. Thus, the loop filter 124 provides a feedback loop which controls the gain of the PWM amplifier 100.

The PWM amplifier 100 also includes a comparator 140 having a first input 142 configured to receive the ramp signal V_Ramp and having second and third inputs 144 and 146 configured to receive the respective compensated analog signals Vin_A_Comp and Vin_B_Comp. The comparator 140 is configured to provide first and second PWM gate signals PWM_A and PWM_B which are pulse trains of fixed amplitude but varying width and separation. The first PWM gate signal PWM_A drives the first Y-bridge driver and the second PWM gate signal PWM_B drives the second Y-bridge driver. In response to the first gate signal PWM_A and an inverted first gate signal PWM_A_Inv, the first Y-bridge driver 104 provides a first differential output signal Out_1 at a first differential output terminal 170, and in response to the second gate signal PWM_B and an inverted second gate signal PWM_B_Inv, the second Y-bridge driver provides a second differential output signal Out_2 at a second differential output terminal 172. The first and second differential output signals Out_1 and Out_2 drive a transducer load $R_L$ (e.g., speaker) coupled to the differential output terminals 170 and 172.

In an exemplary embodiment of the present disclosure, the PWM amplifier 100 includes a minimum duty cycle logic circuit 160 configured to receive the first and second differential PWM gate signals PWM_A and PWM_B. If the duty cycle of PWM_A and PWM_B falls below a minimum threshold duty cycle, the logic circuit 160 provides PWM_A and PWM_B having a minimum threshold duty cycle.

Thus, the PWM amplifier 100 relies on a single ramp generator, i.e., the ramp generator 130, to provide the ramp signal V_Ramp which has the first or the second slope. When the Y-bridge driver 104 is switched to Vs_HIGH, the ramp signal V_Ramp having the first slope is applied to the comparator 140, and when the Y-bridge driver 104 is switched to Vs_LOW, the ramp signal V_Ramp having the second slope is applied to the comparator 140.

Figure 2A:
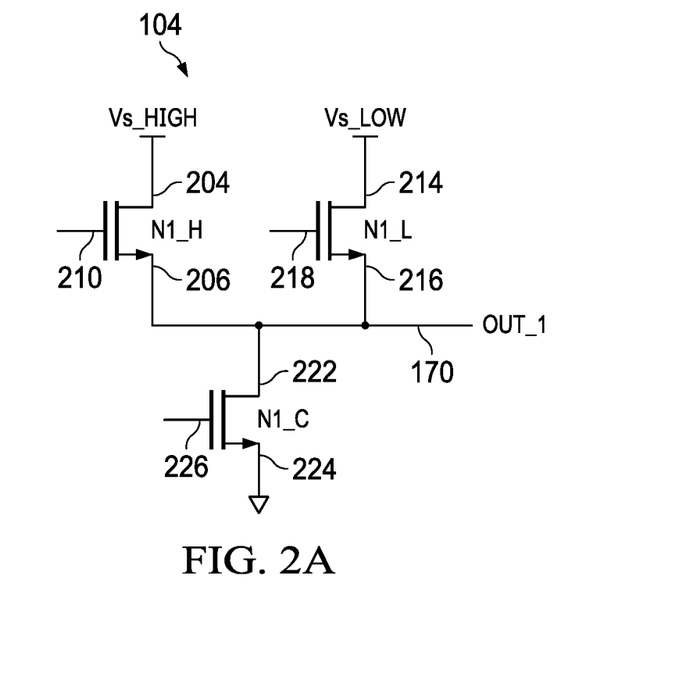
FIGS. 2A-2B illustrate Y-bridge drivers.

FIG. 2A illustrates the first Y-bridge driver 104 in more detail. The Y-bridge driver 104 includes a first high-side NMOS transistor N1_H which includes a drain terminal 204 configured to receive a first voltage supply (e.g., Vs_HIGH) and includes a source terminal 206 coupled to the first differential output terminal 170. The first high-side NMOS transistor N1_H also includes a gate terminal 210 configured to receive the first PWM gate signal PWM_A responsive to the slope switch signal Slope_Switch being HIGH.

With continuing reference to FIG. 2A, the Y-bridge driver 104 also includes a first low-side NMOS transistor N1_L which includes a drain terminal 214 configured to receive a second voltage supply (e.g., Vs_LOW) and includes a source terminal 216 coupled to the first differential output terminal 170. The first low-side NMOS transistor N1_L also includes a gate terminal 218 configured to receive the first differential PWM gate signal PWM_A responsive to the slope switch signal Slope_Switch being LOW. The Y-bridge driver 104 also includes a first common NMOS transistor N1_C which includes a drain terminal 222 coupled to the first differential output terminal and includes a source terminal 224 coupled to ground. The first common NMOS transistor N1_C also includes a gate terminal 226 configured to receive an inverted first PWM gate signal PWM_A_Inv. Thus, when PWM_A is HIGH, PWM_A_Inv is LOW, and vice versa.

In operation, when the slope switch Slope_Switch is HIGH, the first PWM gate signal PWM_A is applied to the gate terminal 210 of the NMOS transistor N1_H and the inverted signal PWM_A_Inv is applied to the gate terminal 226 of the NMOS transistor N1_C. Thus, the transistors N1_H and N1_C are operated in a complementary manner, i.e., when N1_H is ON, N1_C is OFF, and vice versa. When N1_H is ON, a switched current flows from Vs_HIGH through N1_H to the load $R_L$ (not shown in FIG. 2A), and when N1_C is ON, a switched current flows from the load $R_L$ (not shown in FIG. 2A) through N1_C to ground.

When the slope switch Slope_Switch is LOW, the first PWM gate signal PWM_A is applied to the gate terminal 218 of NMOS transistors N1_L and the inverted signal PWM_A_Inv is applied to the gate terminal 226 of the NMOS transistor N1_C. Thus, the transistors N1_L and N1_C are operated in a complementary manner, i.e., when N1_L is ON, N1_C is OFF and vice versa. When N1_L is ON, a switched current flows from Vs_LOW through N1_L to the load $R_L$ (not shown in FIG. 2A), and when N1_C is ON, a switched current flows from the load $R_L$ (not shown in FIG. 2A) through N1_C to ground. Thus, responsive to the first PWM gate signal PWM_A and the inverted signal PWM_A_Inv, a pulsed voltage (i.e., Out_1) having an amplitude Vs_HIGH or Vs_LOW appears at the first differential output terminal 170.

Figure 2B:
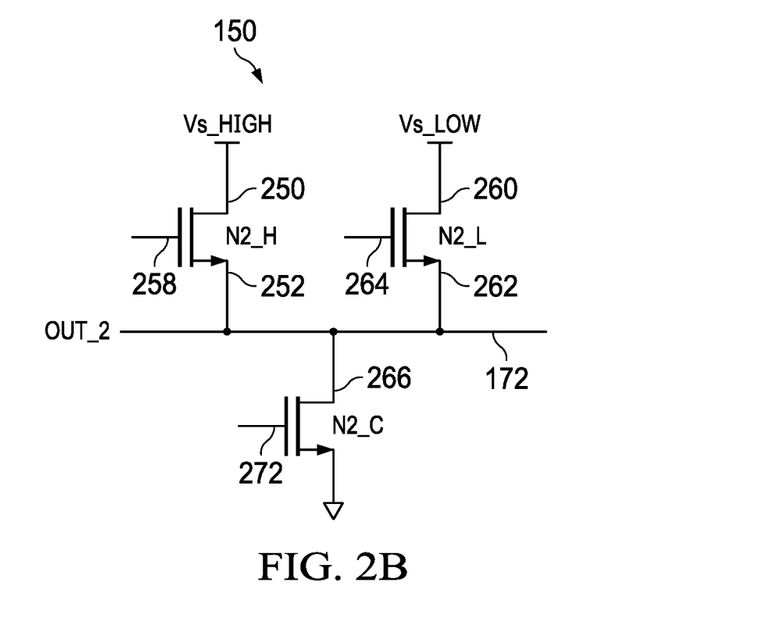

FIG. 2B illustrates a second Y-bridge driver 150 in more detail. The second Y-bridge driver 150 includes a second high-side NMOS transistor N2_H which includes a drain terminal 250 configured to receive the first voltage supply (e.g., Vs_HIGH) and includes a source terminal 252 coupled to the second differential output terminal 172. The second high-side NMOS transistor N2_H also includes a gate terminal 258 configured to receive the second PWM gate signal PWM_B responsive to the slope switch signal Slope_Switch being HIGH.

With continuing reference to FIG. 2B, the second Y-bridge driver 150 also includes a second low-side NMOS transistor N2_L which includes a drain terminal 260 configured to receive the second voltage supply (e.g., Vs_LOW) and includes a source terminal 262 coupled to the second differential output terminal 272. The second low-side NMOS transistor N2_L also includes a gate terminal 264 configured to receive the second PWM gate signal PWM_B responsive to the slope switch signal Slope_Switch being LOW. The second Y-bridge driver 150 also includes a second common NMOS transistor N2_C which includes a drain terminal 266 coupled to the second differential output terminal 272 and includes a source terminal 270 coupled to ground. The second common NMOS transistor N2_C also includes a gate terminal 272 configured to receive an second inverted PWM gate signal PWM_B_Inv.

In operation, when the slope switch Slope_Switch is HIGH, the second PWM gate signal PWM_B is applied to the gate terminal 250 of the NMOS transistor N2_H and the inverted signal PWM_B_Inv is applied to the gate terminal 272 of the NMOS transistor N2_C. Thus, the transistors N2_H and N2_C are operated in a complementary manner, i.e., when N2_H is ON, N2_C is OFF and vice versa. When N2_H is ON, a switched current flows from Vs_HIGH through N2_H to the load $R_L$ (not shown in FIG. 2A), and when and N2_C is ON, a switched current flows from the load $R_L$ (not shown in FIG. 2A) through N2_C to ground.

When the slope switch Slope_Switch is LOW, the second PWM gate signal PWM_B is applied to the gate terminal 264 of NMOS transistors N2_L and the inverted signal PWM_B_Inv is applied to the gate terminal 272 of the NMOS transistor NC_C. Thus, the transistors N2_L and N2_C are operated in a complementary manner, i.e., when N2_L is ON, N2_C is OFF and vice versa. When N2_L is ON, a switched current flows from Vs_LOW through N2_L to the load $R_L$ (not shown in FIG. 2A) and when N2_C is ON, a switched current flows from the load $R_L$ (not shown in FIG. 2A) through N2_C to ground. Thus, responsive to the second PWM gate signal PWM_B and the inverted signal PWM_B_Inv, a pulsed voltage (i.e., Out_2) having an amplitude Vs_HIGH or Vs_LOW appears at the second differential output terminal 172.

In an exemplary embodiment of the present disclosure, the synchronization logic circuit 116 provides a voltage supply mode signal Voltage_Mode to the Y-bridge drivers 104 and 150. In response the Y-bridge drivers 104 and 150 are switched to either Vs_HIGH or Vs_LOW.

Figure 3:
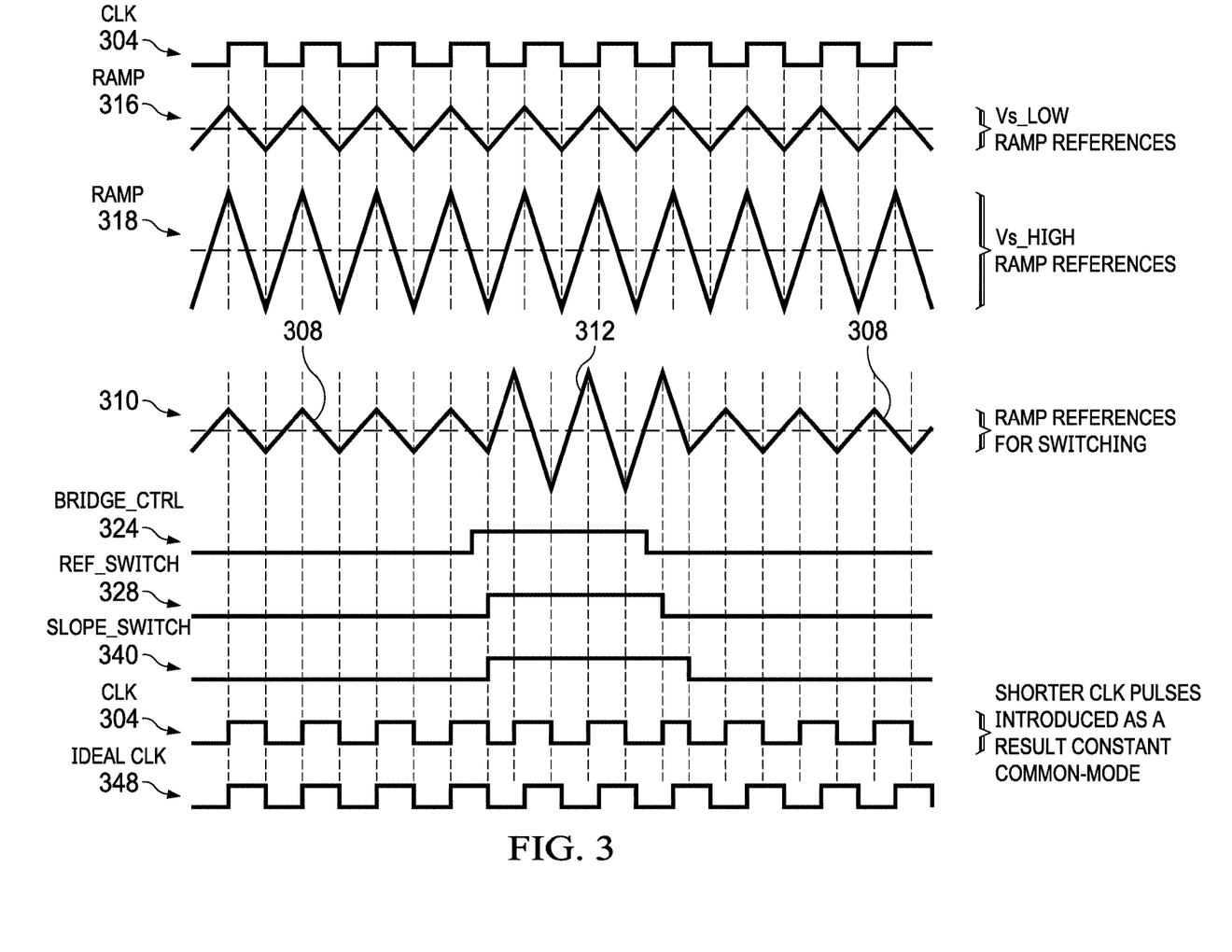
FIGS. 3-5 are timing diagrams of waveforms generated by the PWM amplifier.

FIG. 3 are timing diagrams of waveforms when the PWM amplifier 100 is operated in the oscillation mode. With reference to FIG. 3, a clock signal 304 is generated by the ramp generator 130 by comparing a ramp signal 308 with Vs_HIGH and Vs_LOW. The ramp signal 308 is generated by using Vs_HIGH, Vs_LOW and a desired audio signal gain. The ramp signal 308 has a first slope 312 corresponding to Vs_HIGH and has a second slope 310 corresponding to Vs_LOW. The ramp signal 308 produces the first slope 312 when the Y-bridge is connected to Vs_HIGH and produces the second slope 310 when the Y-bridge is connected to Vs_LOW. For illustration purposes, a ramp signal 316 having only the first slope and a ramp signal 318 having only the second slope is shown.

With continuing reference to FIG. 3, a bridge control signal 324 indicates if peak output power or an average (or low) output power is necessary for audio delivery. A reference switch signal 328 is generated using the bridge control signal 324 and the clock signal. During a LOW to HIGH transition, the rising edge of the reference switch signal 328 is coincident with a transition of the clock signal 304 after the rising edge of the bridge control signal 324. Thus, when the bridge control signal 324 transitions from LOW to HIGH, the reference switch signal 328 does not concurrently transition from LOW to HIGH. Rather, the LOW to HIGH transition of the reference switch signal 328 is delayed until there is a transition of the clock signal 304 after the LOW to HIGH transition of the bridge control signal 324.

Likewise, during a HIGH to LOW transition, the falling edge of the reference switch signal 328 is coincident with a transition of the clock signal 304 after the falling edge of the bridge control signal 324. Thus, when the bridge control signal 324 transitions from HIGH to LOW, the reference switch signal 328 does not concurrently transition from HIGH to LOW. Rather, the HIGH to LOW transition of the reference switch signal 328 is delayed until there is a transition of the clock signal 304 after the HIGH to LOW transition of the bridge control signal 324.

With continuing reference to FIG. 3, a slope switch signal 340 is generated using the reference switch signal 328 and the clock signal 304. During a LOW to HIGH transition, the rising edge of the slope switch signal 340 is coincident with the rising edge of the reference switch signal 324. Thus, when the reference switch signal 324 transitions from LOW to HIGH, the slope switch signal 340 concurrently transitions from LOW to HIGH. However, during a HIGH to LOW transition, the falling edge of the slope switch signal 340 lags the falling edge of the reference switch signal 324 by a half clock period of the clock signal 304. Thus, when the reference switch signal 324 transitions from HIGH to LOW, the slope switch signal 340 does not concurrently transition from HIGH to LOW. Rather, the HIGH to LOW transition of the slope switch signal 340 is delayed by a half clock cycle after the HIGH to LOW transition of the reference switch signal 324.

As discussed before, responsive to the slope switch signal 340 the ramp generator 130 switches the slope of the ramp signal 308 from the first slope 312 to the second slope 310 and vice versa. Also, the ramp generator 130 provides the clock signal 304 using the ramp signal 308. Due to a constant common mode of the ramp signal 308 as it switches between the first slope 312 and the second slope 310, shorter clock pulses 344 and 346 are introduced when the ramp signal 308 transitions from LOW to HIGH and also from HIGH to LOW. For illustration purposes, an ideal clock signal 348 is shown below the clock signal 304 having shorter pulses 344 and 346.

Next, the operation in the synchronization mode is described. With reference to FIG. 1, in the synchronization mode, the synchronization logic circuit 116 receives the bridge control signal Bridge_Control at the first input 118 and receives the external clock signal CLK_EXT at the second input 120. As discussed before, in the synchronization mode, the external clock signal CLK_EXT is provided to the synchronization logic circuit 116 as the Class D clock. Also, the synchronization logic circuit 116 receives a positive trigger signal Positive_Trig at a third input 160 and receives a negative trigger signal Negative_Trig at a fourth input 162. In response, the synchronization logic circuit 116 provides the slope switch signal Slope_Switch and the reference switch signal Ref_Switch. Additionally, in the synchronization mode the synchronization logic circuit 116 provides a freeze ramp signal Freeze_Ramp. The positive trigger signal Positive_Trig indicates when a positive peak of the ramp signal V_Ramp reaches an upper ramp reference voltage and the negative trigger signal Negative_Trig indicates when a negative peak of the ramp signal V_Ramp reaches a lower ramp reference voltage.

In the synchronization mode, the ramp generator 130 receives the high voltage supply Vs_High at the first input 132 and receives the low voltage supply Vs_LOW at the second input 134 and receives the reference switch signal Ref_Switch at the third input 136 and receives the slope switch signal Slope_Switch at the fourth input 138. Additionally, in the synchronization mode, the ramp generator 130 receives the freeze ramp signal Freeze_Ramp at a fifth input 135 and the external clock signal CLK_Ext at a sixth input 137. The external clock signal CLK_Ext is provided by an external clock. In response, the ramp generator 130 provides the ramp signal V_Ramp having the first slope responsive to the slope switch signal Slope_Switch in a first state and having the second slope responsive to the slope switch signal Slope_Switch in a second state. The ramp generator 130 also provides the positive trigger signal Positive_Trig which indicates when a positive peak of the ramp signal V_Ramp reaches an upper ramp reference voltage, and provides the negative trigger signal Negative_Trig which indicates when a negative peak of the ramp signal V_Ramp reaches a lower ramp reference voltage.

With continuing reference to FIG. 1, the comparator 140 receives the ramp signal V_Ramp at the first input and receives the first and second compensated analog signals Vin_A_Comp and Vin_B_Comp at the respective second and third inputs 144 and 146. In response, the comparator provides the first and second differential PWM gate signals PWM_A and PWM_B.

Figure 4:
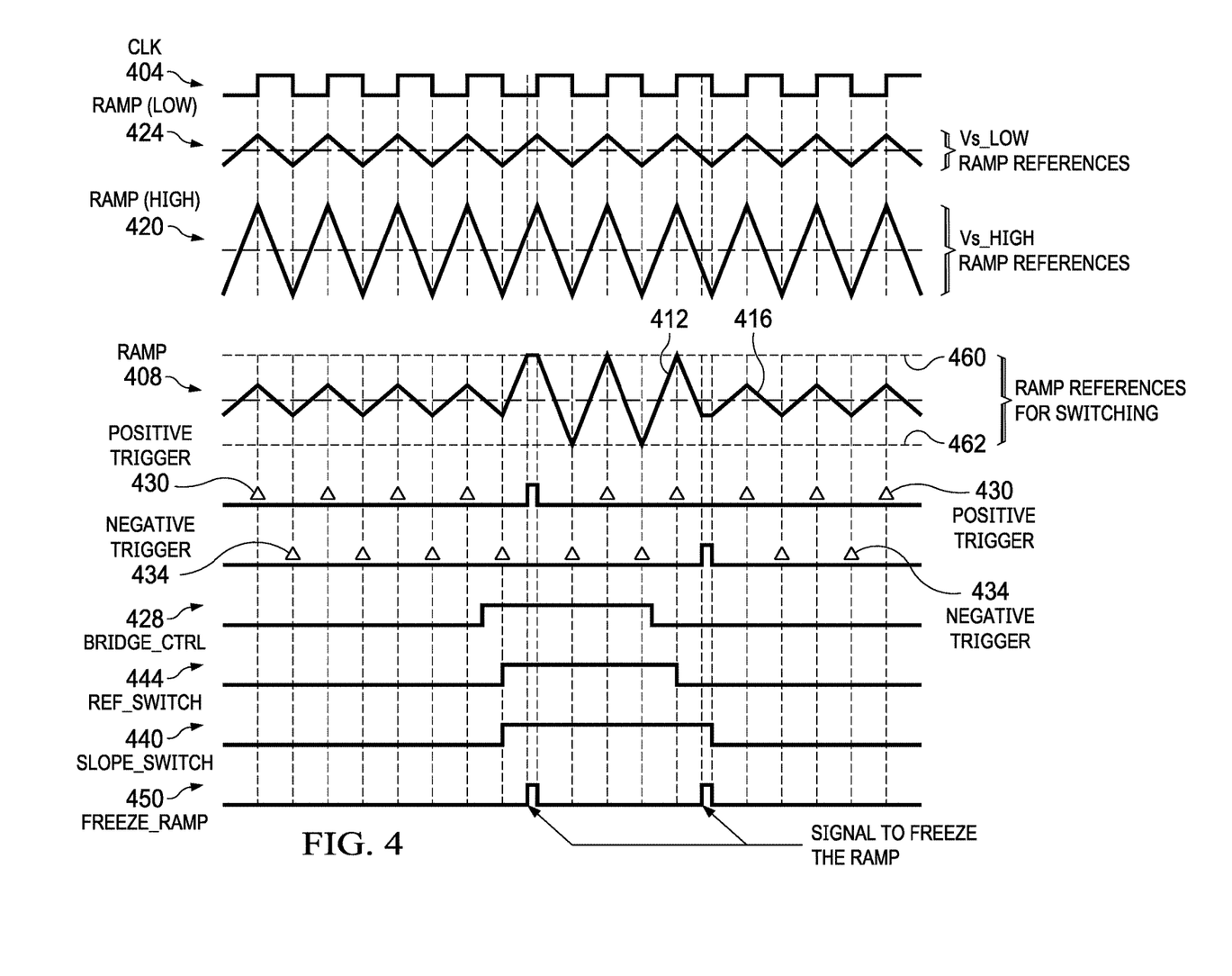

FIG. 4 are timing diagrams of waveforms during a synchronization mode operation. With reference to FIG. 4, an external clock signal 404 is provided to the ramp generator 130 and also provided to the synchronization logic circuit 116 (as the Class D clock), and a ramp signal 408 is generated using Vs_HIGH, Vs_LOW, the external clock signal 404, and a desired audio signal gain. The ramp signal 408 has a first slope 412 corresponding to Vs_HIGH and has a second slope 416 corresponding to Vs_LOW. The ramp signal 408 produces the first slope 412 when the Y-bridge is connected to Vs_HIGH and produces the second slope 416 when the Y-bridge is connected to Vs_LOW. For illustration purposes, a ramp signal 420 having only the first slope and a ramp signal 424 having only the second slope is shown.

With continuing reference to FIG. 4, the synchronization logic circuit 116 receives a bridge control signal 428, the external clock signal 404 (as the Class D clock), a positive trigger signal 430 and a negative trigger signal 434. In response, the synchronization logic circuit 116 provides a slope switch signal 440 and a reference switch signal 444. The positive trigger signal 430 indicates when the rising ramp signal 408 reaches an upper reference voltage 460 and the negative trigger signal 434 indicates when the falling ramp signal 408 reaches a lower reference voltage 462. As illustrated in FIG. 4, the upper reference voltage 460 and the lower reference voltage vary depending on whether the Y-bridge driver is coupled to Vs_HIGH or Vs_LOW.

With continuing reference to FIG. 4, if the ramp signal 408 rises above the upper reference voltage 460, a freeze ramp signal 450 is provided by the synchronization logic circuit 116, and in response the ramp signal 408 is held frozen at the upper reference voltage level until the next transition of the clock signal 404. If the ramp signal 408 falls below the lower reference voltage 462, the freeze ramp signal 450 is provided, and in response the ramp signal 408 is held frozen at the lower reference voltage level until the next transition of the clock signal 404.

Thus, during an ascent the ramp signal 408 is held frozen at the upper reference voltage level when the ramp signal 408 rises above the upper reference voltage 460. After the ramp signal 408 is held frozen for a freeze duration, the ramp signal 408 begins a descent upon the occurrence of the next transition of the clock signal 404. Similarly, during a descent the ramp signal 408 is held frozen at the lower reference voltage level if the ramp signal 408 falls below the lower reference voltage 462. After the ramp signal is held frozen during the freeze duration, the ramp signal 408 begins an ascent upon the occurrence of the next transition of the clock signal 404.

Figure 5:
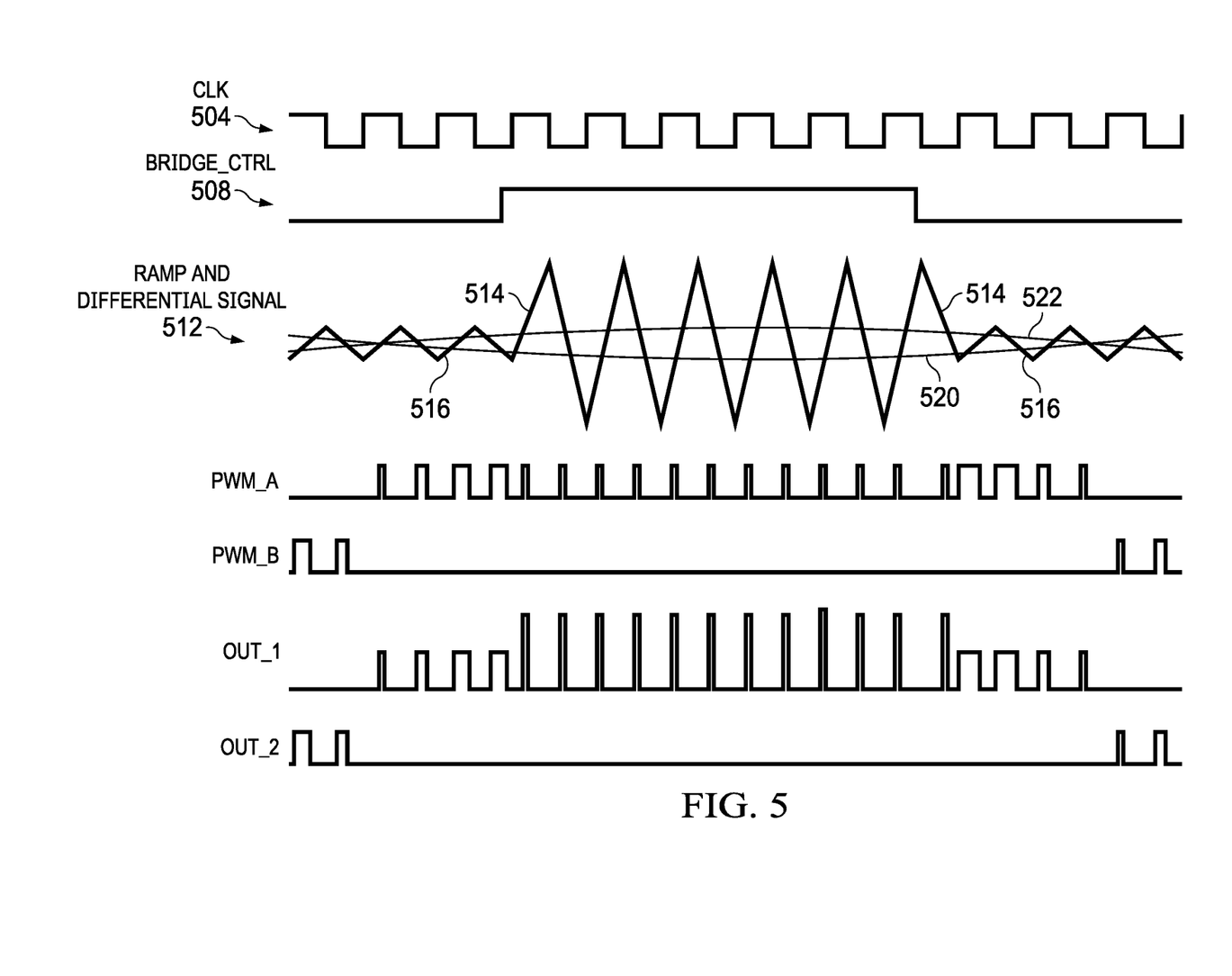

FIG. 5 are timing diagrams of waveforms. With reference to FIG. 5, responsive to a clock signal 504 and a bridge control signal 508, a ramp signal 512 is produced. The ramp signal 512 has a first slope 514 corresponding to Vs_HIGH and has a second slope 516 corresponding to Vs_LOW. The ramp signal is compared to compensated differential analog signals 520 and 522, and resulting PWM_A and PWM_B signals are produced. The differential PWM_A and PWM_B signals have fixed amplitude but varying width and separation, and they are used as gate signals to drive the first and second Y-bridge drivers 104 and 150. The Y-bridge drivers provide differential output signals Out_1 and Out_2 that drive the load $R_L$. When the Y-bridge drivers are coupled to Vs_HIGH, the amplitude of the output signals Out_1 and Out_2 is Vs_HIGH, and when the Y-bridge drivers are coupled to Vs_LOW, the amplitude of the output signals Out_1 and Out_2 is Vs_LOW.

Various illustrative components, blocks, modules, circuits, and steps have been described above in general terms of their functionality. Whether such functionality is implemented as hardware or software depends upon the particular application and design constraints imposed on the overall system. The described functionality may be implemented in varying ways for each particular application, but such implementation decision should not be interpreted as causing a departure from the scope of the present disclosure.

For simplicity and clarity, the full structure and operation of all systems suitable for use with the present disclosure is not being depicted or described herein. Instead, only so much of a system as is unique to the present disclosure or necessary for an understanding of the present disclosure is depicted and described.

What is claimed is:

1. A pulse width modulated (PWM) amplifier, comprising:
    a digital-to-analog converter (DAC) having an input and first and second outputs;
    a synchronization logic circuit having a first input, having a second input and first and second outputs;
    a ramp generator having a first input a second input, third input, coupled to the first output of the synchronization logic circuit, a fourth input coupled to the second output of the synchronization logic circuit and an output;
    a loop filter having first and second inputs coupled to the first and second outputs of the DAC respectively, having a third input coupled to a first differential output voltage and having a fourth input coupled to a second differential output voltage and first and second outputs; and
    a comparator having a first input coupled to the output of the ramp generator, and having second and third inputs coupled to the first and second outputs of the loop filter, and the comparator having first and second outputs.

2. The PWM amplifier of claim 1, further comprising:
    a first Y-bridge driver having a first input coupled to the first output of the comparator and a second input coupled to an inverted version of the first output, and a differential output; and
    a second Y-bridge driver having a first input coupled to the second output of the comparator and a second input coupled to an inverted version of the second output and to provide the first differential output voltage, and a differential output.

3. A pulse width modulated (PWM) amplifier, comprising:
    a digital-to-analog converter (DAC) having an input configured to receive digital audio data, and the DAC configured to provide first and second differential analog audio signals;
    a synchronization logic circuit having a first input configured to receive a bridge control signal and having a second input configured to receive a clock signal, the synchronization logic circuit configured to provide a slope switch signal and a reference switch signal;
    a ramp generator having a first input configured to receive a first voltage supply and having a second input configured to receive a second voltage supply and having a third input configured to receive the reference switch signal and having a fourth input configured to receive the slope switch signal, the ramp generator configured to provide a ramp signal having a first slope responsive to the slope switch signal in a first state and having a second slope responsive to the slope switch signal in a second state and to provide the clock signal;
    a loop filter having a first input configured to receive the first differential analog audio signal and having a second input configured to receive the second differential analog audio signal and having a third input configured to receive a first differential output signal and having a fourth input configured to receive a second differential output signal, the loop filter configured to provide first and second compensated analog signals;
    a comparator having a first input configured to receive the ramp signal and having second and third inputs configured to receive the respective first and second compensated analog signals, the comparator configured to provide first and second PWM gate signals;
a first Y-bridge driver configured to receive the first PWM gate signal and an inverted first PWM gate signal and to provide the first differential output signal; and
a second Y-bridge driver configured to receive the second PWM gate signal and an inverted second PWM gate signal and to provide the second differential output signal.

4. The PWM amplifier of claim 3, wherein a LOW to HIGH transition of the slope switch signal and a LOW to HIGH transition of the reference switch signal occur concurrently, and wherein a HIGH to LOW transition of the slope switch signal lags a HIGH to LOW transition of the reference switch signal by a half clock cycle period of the clock signal.

5. The PWM amplifier of claim 3, wherein the ramp generator is configured to provide the ramp signal having the first slope responsive to the slope switch being HIGH, and wherein the ramp generator is configured to provide the ramp signal having the second slope responsive to the slope switch being LOW.

6. A Y-bridge driver system, comprising:
a first Y-bridge comprising:
a first high-side NMOS transistor having a drain terminal configured to receive a first voltage supply and having a source terminal coupled to a first differential output terminal, the first high-side NMOS transistor having a gate terminal configured to receive a first pulse width modulated (PWM) gate signal responsive to a slope switch signal being HIGH;
a first low-side NMOS transistor having a drain terminal configured to receive a second voltage supply and having a source terminal coupled to the first differential output terminal, the first low-side NMOS transistor having a gate terminal configured to receive a first PWM gate signal responsive to the slope switch signal being LOW;
a first common NMOS transistor having a drain terminal coupled to the first differential output terminal and having a source terminal coupled to ground, the first common NMOS transistor having a gate terminal configured to receive an inverted first PWM gate signal,
wherein the first Y-bridge is configured to provide a first differential output signal at the first differential output terminal;
a second Y-bridge comprising:
a second high-side NMOS transistor having a drain terminal configured to receive the first voltage supply and having a source terminal coupled to a second differential output terminal, the second high-side NMOS transistor having a gate terminal configured to receive a second PWM gate signal responsive to the slope switch signal being HIGH;
a second low-side NMOS transistor having a drain terminal configured to receive a second voltage supply and having a source terminal coupled to the second differential output terminal, the second low-side NMOS transistor having a gate terminal configured to receive the second PWM gate signal responsive to the slope switch signal being LOW;
a second common NMOS transistor having a drain terminal coupled to the second differential output terminal and having a source terminal coupled to ground, the second common NMOS transistor having a gate terminal configured to receive an inverted second PWM gate signal,
wherein the second Y-bridge is configured to provide a second differential output signal at the second differential output terminal;
a digital-to-analog converter (DAC) having an input configured to receive digital audio data and to provide first and second differential analog audio signals;
a synchronization logic circuit having a first input configured to receive a bridge control signal and having a second input configured to receive a clock signal, the synchronization logic circuit configured to provide the slope switch signal and a reference switch signal;
a ramp generator having a first input configured to receive the first voltage supply and having a second input configured to receive the second voltage supply and having a third input configured to receive the reference switch signal and having a fourth input configured to receive the slope switch signal, the ramp generator configured to provide a ramp signal having a first slope responsive to the slope switch signal in a first state and having a second slope responsive to the slope switch signal in a second state and to provide the clock signal; and
a loop filter having a first input configured to receive the first differential analog audio signal and having a second input configured to receive the second differential analog audio signal and having a third input configured to receive the first differential output signal and having a fourth input configured to receive the second differential output signal, the loop filter configured to provide first and second compensated analog signals; and
a comparator having a first input configured to receive the ramp signal and having second and third inputs configured to receive the respective first and second compensated analog signals, the comparator configured to provide first and second differential PWM gate signals.

7. The Y-bridge driver system of claim 6, wherein a rising edge of the reference switch signal is coincident with a transition of the clock signal after a rising edge of the bridge control signal, and wherein a falling edge of the reference switch signal is coincident with a transition of the clock signal after a falling edge of the bridge control signal.

8. The Y-bridge driver system of claim 6, wherein a rising edge of the slope switch signal is coincident with a rising edge of the reference switch signal, and wherein a falling edge of the slope switch signal lags a falling edge of the reference switch signal by a half clock period of the clock signal.

9. The Y-bridge driver system of claim 6, wherein a LOW to HIGH transition of the slope switch signal and a LOW to HIGH transition of the reference switch signal occur concurrently, and wherein a HIGH to LOW transition of the slope switch signal lags a HIGH to LOW transition of the reference switch signal by a half clock period of the clock signal.

10. The Y-bridge driver system of claim 6, wherein the ramp generator is configured to provide the ramp signal having the first slope responsive to the slope switch being HIGH, and wherein the ramp generator is configured to provide the ramp signal having the second slope responsive to the slope switch being LOW.

* * * * *